US012693603B2

(12) United States Patent
Cheng et al.

(10) Patent No.: US 12,693,603 B2
(45) Date of Patent: ***Jul. 28, 2026

(54) INSPECTION TOOL FOR AN EXTREME ULTRAVIOLET RADIATION SOURCE TO OBSERVE TIN RESIDUAL

(71) Applicant: Taiwan Semiconductor Manufacturing Company, Ltd., Hsinchu (TW)

(72) Inventors: Chiao-Hua Cheng, Tainan City (TW); Sheng-Kang Yu, Hsinchu City (TW); Shang-Chieh Chien, New Taipei City (TW); Wei-Chun Yen, Tainan City (TW); Heng-Hsin Liu, New Taipei City (TW); Ming-Hsun Tsai, Hsinchu City (TW); Yu-Fa Lo, Kaohsiung (TW); Li-Jui Chen, Hsinchu City (TW); Wei-Shin Cheng, Hsinchu City (TW); Cheng-Hsuan Wu, New Taipei City (TW); Cheng-Hao Lai, Taichung City (TW); Yu-Kuang Sun, Hsinchu City (TW); Yu-Huan Chen, Hsinchu City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 118 days.

This patent is subject to a terminal disclaimer.

(21) Appl. No.: 18/767,684

(22) Filed: Jul. 9, 2024

(65) Prior Publication Data

US 2024/0361701 A1 Oct. 31, 2024

Related U.S. Application Data

(63) Continuation of application No. 17/461,491, filed on Aug. 30, 2021, now Pat. No. 12,066,761.

(51) Int. Cl.
*G03F 7/00* (2006.01)

(52) U.S. Cl.
CPC ...... *G03F 7/70483* (2013.01); *G03F 7/70033* (2013.01); *G03F 7/7085* (2013.01)

(58) Field of Classification Search
CPC . G03F 7/70033; G03F 7/70483–70541; G03F 7/7055; G03F 7/70558;
(Continued)

(56) References Cited

U.S. PATENT DOCUMENTS 8,796,666 B1 8/2014 Huang et al.
9,093,530 B2 7/2015 Huang et al.
(Continued)

FOREIGN PATENT DOCUMENTS

CN 110672637 A 1/2020

OTHER PUBLICATIONS

Non-Final Office Action issued in U.S. Appl. No. 17/461,491, dated May 18, 2022.
(Continued)

*Primary Examiner* — Christina A Riddle
(74) *Attorney, Agent, or Firm* — STUDEBAKER BRACKETT PLLC

(57) ABSTRACT

A method of inspecting an extreme ultraviolet (EUV) radiation source includes, in an idle mode, inserting a borescope mounted on a fixture through a first opening into a chamber of the EUV radiation source. The borescope includes a connection cable attached at a first end to a camera. The EUV radiation source includes an excitation laser that generates a light beam that is configured to focus onto tin droplets to generate EUV radiation inside the chamber of the EUV radiation source. The method further includes extending the extendible section, in a direction toward the second opening of the EUV radiation source, to move the camera
(Continued)

beyond the blocking shield, and acquiring one or more images from a region beyond the blocking shield. The method also includes analyzing the one or more acquired images to determine an amount of tin debris deposited inside the chamber of the EUV radiation source.

20 Claims, 9 Drawing Sheets

(58) Field of Classification Search
CPC .. G03F 7/70591; G03F 7/708; G03F 7/70808; G03F 7/70816; G03F 7/70825; G03F 7/70833; G03F 7/70841; G03F 7/7085; G03F 7/70858; G03F 7/70883; G03F 7/70908–70941; G03F 7/7095; G03F 7/70975; G03F 7/70991; G03F 7/2037; G03F 7/2039; G03F 7/70175; H01L 21/67253; G01N 21/956; G01N 21/95607; G01N 21/95623; G01N 21/95684; G01N 21/958; G01N 21/954; G01N 21/8806; G01N 21/94; G01N 2021/95615; G01N 2021/9563; G01N 2021/95653; G01N 2021/95676; G01N 2021/9542–9548; H05G 2/00–0094
USPC ..... 355/30, 67–71, 72–77; 356/237.1–237.6; 250/492.1, 492.2, 492.22, 493.1, 494.1, 250/503.1, 504 R, 505.1
See application file for complete search history.

(56) References Cited

U.S. PATENT DOCUMENTS

| | | | |
|---|---|---|---|
| 9,184,054 B1 | 11/2015 | Huang et al. | |
| 9,256,123 B2 | 2/2016 | Shih et al. | |
| 9,529,268 B2 | 12/2016 | Chang et al. | |
| 9,548,303 B2 | 1/2017 | Lee et al. | |
| 9,618,837 B2 | 4/2017 | Lu et al. | |
| 9,869,928 B2 | 1/2018 | Huang et al. | |
| 9,869,934 B2 | 1/2018 | Huang et al. | |
| 9,869,939 B2 | 1/2018 | Yu et al. | |
| 12,066,761 B2 * | 8/2024 | Cheng | G03F 7/70483 |
| 2008/0210889 A1 | 9/2008 | Suganuma et al. | |
| 2009/0314967 A1 | 12/2009 | Moriya et al. | |
| 2012/0075611 A1 | 3/2012 | Bieg et al. | |
| 2013/0194412 A1 | 8/2013 | Hatcher et al. | |
| 2016/0207078 A1 | 7/2016 | Becker et al. | |
| 2019/0033225 A1 | 1/2019 | Chang et al. | |
| 2020/0133137 A1 | 4/2020 | Sugisawa | |
| 2022/0326624 A1 | 10/2022 | Cheng et al. | |

OTHER PUBLICATIONS

Advisory Action issued in U.S. Appl. No. 17/461,491, dated Jan. 26, 2023.

Non-Final Office Action issued in U.S. Appl. No. 17/461,491, dated Jul. 6, 2023.

Final Office Action issued in U.S. Appl. No. 17/461,491, dated Oct. 14, 2022.

Notice of Allowance issued in U.S. Appl. No. 17/461,491, dated Apr. 9, 2024.

* cited by examiner

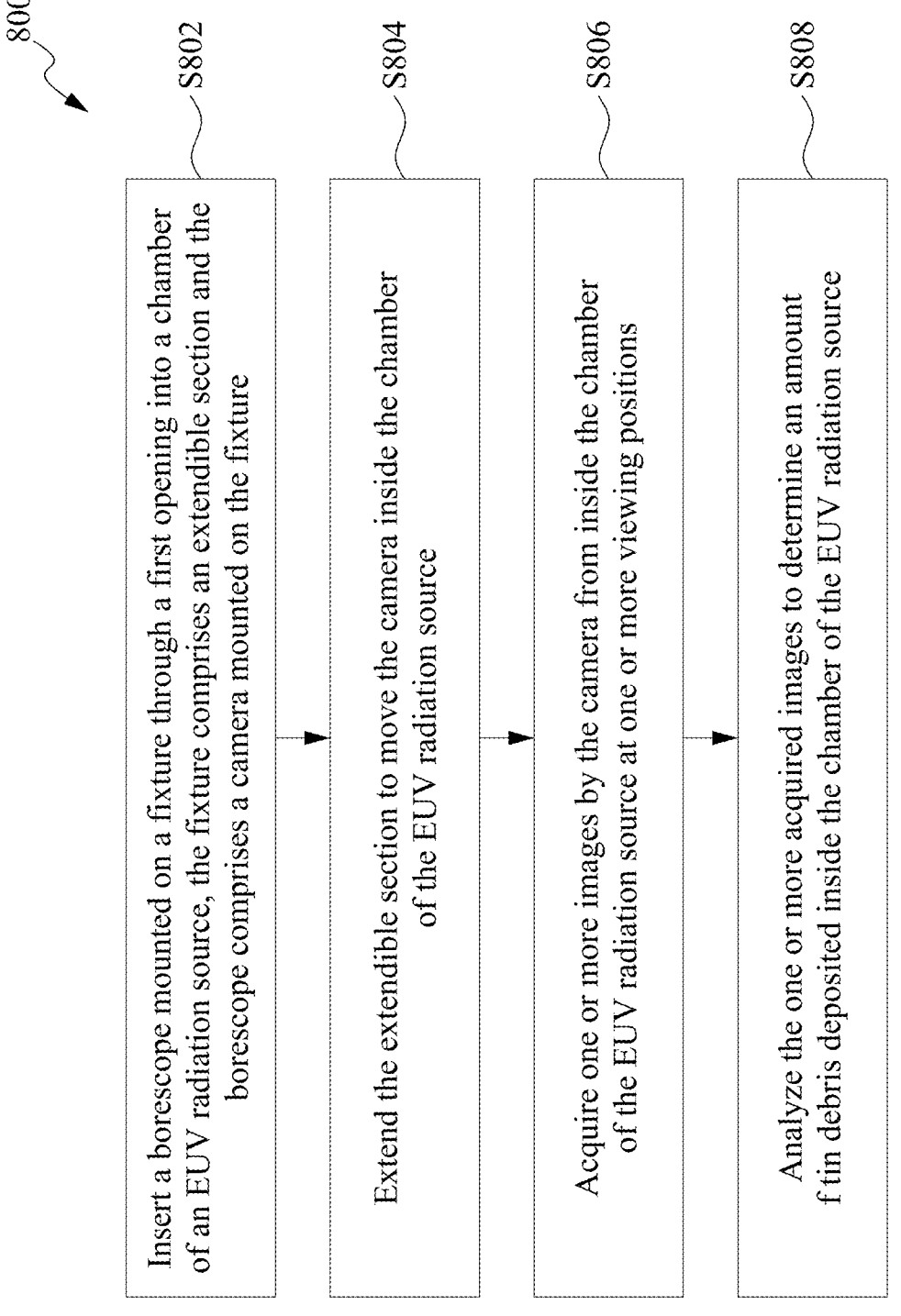

800

S802 Insert a borescope mounted on a fixture through a first opening into a chamber of an EUV radiation source, the fixture comprises an extendible section and the borescope comprises a camera mounted on the fixture S804 Extend the extendible section to move the camera inside the chamber of the EUV radiation source S806 Acquire one or more images by the camera from inside the chamber of the EUV radiation source at one or more viewing positions S808 Analyze the one or more acquired images to determine an amount f tin debris deposited inside the chamber of the EUV radiation source

Fig. 8

INSPECTION TOOL FOR AN EXTREME ULTRAVIOLET RADIATION SOURCE TO OBSERVE TIN RESIDUAL

RELATED APPLICATION

This application is a continuation application of U.S. patent Ser. No. 17/461,491 filed on Aug. 30, 2021, now U.S. Pat. No. 12,066,761, the entire content of which is incorporated herein by reference.

BACKGROUND

Decreasing component size in semiconductor manufacturing requires further improvements in resolution of lithography systems which are achievable using extreme ultraviolet lithography (EUVL). EUVL employs radiation having a wavelength of about 1-100 nm. One method for producing EUV radiation is laser-produced plasma (LPP). In an LPP-based EUV source, a high-power laser beam is focused on small droplet targets of metal, such as tin, to form a highly ionized plasma that generates EUV radiation with a peak maximum emission at 13.5 nm.

A portion of the tin plasma may be deposited as tin debris on different locations of a chamber of an EUV radiation source. The deposited tin debris, e.g., tin residual, near an opening where the EUV radiation exits the EUV radiation source may reduce the intensity of the generated EUV radiation and may also change the direction of the generated EUV radiation. It is desirable to determine when the deposited tin debris exceeds a threshold and when the EUV radiation source requires cleaning.

BRIEF DESCRIPTION OF THE DRAWING

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 8 shows a process for inspecting inside the chamber of the EUV radiation source for semiconductor manufacturing in accordance with some embodiments of the present disclosure.

DETAILED DESCRIPTION

Figure 1:
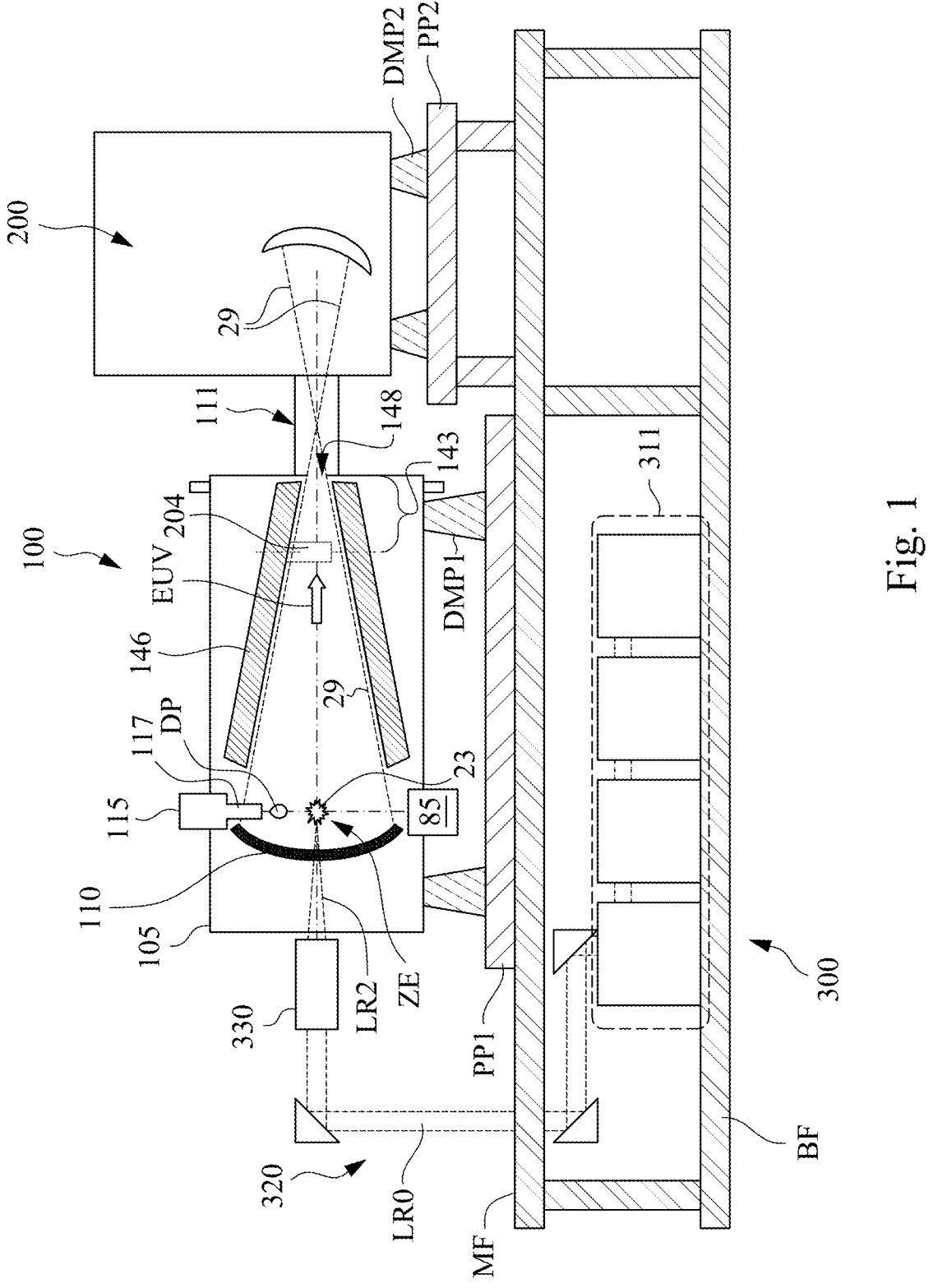
FIG. 1 is a schematic view of an EUV lithography system for semiconductor manufacturing with a laser produced plasma (LPP) EUV radiation source.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "being made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described.

In some embodiments, the EUV radiation in the EUV radiation source of an extreme ultraviolet lithography (EUVL) system is produced by directing a focused laser beam, from an excitation laser, at metal droplets to produce highly ionized metal plasma that generates EUV radiation. The metal plasma, when cooled, is deposited on the walls of the chamber of the EUV radiation source and/or various components inside the chamber of the EUV radiation source, and produces metal residues. The collector mirror, also referred to as an LPP collector mirror or an EUV collector mirror, is an important component of the LPP EUV radiation source. In some embodiments, the chamber of the EUV radiation source has a cone shape and the collector mirror collects and reflects, e.g., directs, the EUV radiation to exit the chamber of the EUV radiation source through an opening that is produced at a vertex of the cone shape. In some embodiments, the deposited metal residue, in a region next to the vertex of the cone shape and the opening at the vertex of the cone shape, reduces the intensity of the generated EUV radiation, change the direction of the EUV radiation, and contributes to overall EUV conversion efficiency. In particular, tin (Sn) residues, e.g., debris, are one of the contamination sources of the EUV radiation source.

Monitoring an amount of the debris deposited inside the chamber of the EUV radiation source is important to determine when to clean the chamber of the EUV radiation source. In some embodiments, a blocking shield is mounted in the chamber of the EUV radiation source to prevent the light beam of the excitation laser to escape from vertex of the cone shape of the EUV radiation source. The blocking shield prevents a camera mounted on the walls of the chamber of the EUV radiation source from acquiring images of the intermediate focus (IF) cap region that is in the vicinity of the vertex of the cone shape, e.g., the region between the blocking shield and the vertex of the cone shape.

In some embodiments, one of the droplet generator or the droplet catcher of the EUV radiation source is detached and an opening is produced in the wall of the chamber of the EUV radiation source and an observation system is entered through the opening. In some embodiments, the observation system includes a borescope that is attached to an extendible assembly. The extendible assembly is mounted over a lead screw. The camera of the borescope is attached to an end of the extendible assembly. By rotating the lead screw, the extendible assembly stretches and moves the camera of the borescope beyond the blocking shield and allows the borescope to acquire one or more images of the IF cap region. In some embodiments, a view controller and an image processing system is included in the observation system and controls the position and viewing angle of the images. The acquired images may be analyzed and an amount of metal debris, e.g., tin debris, deposited in the IF cap region may be determined.

FIG. 1 is a schematic view of an EUV lithography system for semiconductor manufacturing with a laser produced plasma (LPP) EUV radiation source. FIG. 1 shows a schematic view of an EUV lithography system with a laser produced plasma (LPP) EUV radiation source. The EUV lithography system includes an EUV radiation source 100 (an EUV light source) to generate EUV radiation, an exposure device 200, such as a scanner, and an excitation laser source 300. As shown in FIG. 1, in some embodiments, the EUV radiation source 100 and the exposure device 200 are installed on a main floor MF of a clean room, while the excitation laser source 300 is installed in a base floor BF located under the main floor. Each of the EUV radiation source 100 and the exposure device 200 are placed over pedestal plates PP1 and PP2 via dampers DMP1 and DMP2, respectively. The EUV radiation source 100 and the exposure device 200 are coupled to each other by a coupling mechanism, which may include a focusing unit 111. In some embodiments, a lithography system includes the EUV radiation source 100 and the exposure device 200.

The lithography system is an EUV lithography system designed to expose a resist layer by EUV light (also interchangeably referred to herein as EUV radiation). The resist layer is a material sensitive to the EUV light. The EUV lithography system employs the EUV radiation source 100 to generate EUV light, such as EUV light having a wavelength ranging between about 1 nm and about 50 nm. In one particular example, the EUV radiation source 100 generates an EUV light with a wavelength centered at about 13.5 nm.

In the present embodiment, the EUV radiation source 100 utilizes a mechanism of laser-produced plasma (LPP) to generate the EUV radiation. Various components including those described above are integrated together and are operable to perform lithography exposing processes. The lithography system may further include other modules or be integrated with (or be coupled with) other modules.

As shown in FIG. 1, the EUV radiation source 100 includes a droplet generator 115 and a LPP collector mirror 110, enclosed by a chamber 105. The droplet generator 115 generates a plurality of target droplets DP, which are supplied into the chamber 105 through a nozzle 117. In some embodiments, the target droplets DP are tin (Sn), lithium (Li), or an alloy of Sn and Li. In some embodiments, the target droplets DP each have a diameter in a range from about 10 microns ($\mu$m) to about 100 $\mu$m. For example, in an embodiment, the target droplets DP are tin droplets, each having a diameter of about 10 $\mu$m, about 25 $\mu$m, about 50 $\mu$m, or any diameter between these values. In some embodiments, the target droplets DP are supplied through the nozzle 117 at a rate in a range from about 50 droplets per second (i.e., an ejection-frequency of about 50 Hz) to about 50,000 droplets per second (i.e., an ejection-frequency of about 50 kHz). For example, in an embodiment, target droplets DP are supplied at an ejection-frequency of about 50 Hz, about 100 Hz, about 500 Hz, about 1 kHz, about 10 kHz, about 25 kHz, about 50 kHz, or any ejection-frequency between these frequencies. The target droplets DP are ejected through the nozzle 117 and into a zone of excitation ZE (e.g., a target droplet location) at a speed in a range from about 10 meters per second (m/s) to about 100 m/s in various embodiments. For example, in an embodiment, the target droplets DP have a speed of about 10 m/s, about 25 m/s, about 50 m/s, about 75 m/s, about 100 m/s, or at any speed between these speeds.

The excitation laser beam LR2 generated by the excitation laser source 300 is a pulsed beam. The laser pulses of laser beam LR2 are generated by the excitation laser source 300. The excitation laser source 300 may include a laser generator 311, laser guide optics 321 and a focusing apparatus 330. In some embodiments, the laser generator 311 includes a carbon dioxide ($CO_2$) or a neodymium-doped yttrium aluminum garnet (Nd:YAG) laser source with a wavelength in the infrared region of the electromagnetic spectrum. For example, the excitation laser source 300 has a wavelength of 9.4 $\mu$m or 10.6 $\mu$m in an embodiment. The laser light beam LR0 generated by the excitation laser source 300 is guided by the laser guide optics 321 and focused, by the focusing apparatus 330, into the excitation laser beam LR2 that is introduced into the EUV radiation source 100. In some embodiments, in addition to $CO_2$ and Nd:YAG lasers, the laser beam LR2 is generated by a gas laser including an excimer gas discharge laser, helium-neon laser, nitrogen laser, transversely excited atmospheric (TEA) laser, argon ion laser, copper vapor laser, KrF laser or ArF laser; or a solid state laser including Nd:glass laser, ytterbium-doped glasses or ceramics laser, or ruby laser. In some embodiments, a non-ionizing laser beam LR1 (not shown) is also generated by the excitation laser source 300 and the laser beam LR1 is also focused by the focusing apparatus 330 to pre-heat a given target droplet by generating a pre-heat laser pulse.

In some embodiments, the excitation laser beam LR2 includes the pre-heat laser pulse and a main laser pulse. In such embodiments, the pre-heat laser pulse (interchangeably referred to herein as the "pre-pulse) is used to heat (or pre-heat) the given target droplet to create a low-density target plume with multiple smaller droplets, which is subsequently heated (or reheated) by the main laser pulse from the main laser, to generate increased emission of EUV light compared to when the pre-heat laser pulse is not used.

In various embodiments, the pre-heat laser pulses have a spot size about 100 μm or less, and the main laser pulses have a spot size in a range of about 150 μm to about 300 μm. In some embodiments, the pre-heat laser and the main laser pulses have a pulse-duration in the range from about 10 ns to about 50 ns, and a pulse-frequency in the range from about 1 kHz to about 100 kHz. In various embodiments, the pre-heat laser and the main laser have an average power in the range from about 1 kilowatt (kW) to about 50 kW. The pulse-frequency of the excitation laser beam LR2 is matched with the ejection-frequency of the target droplets DP in an embodiment.

The laser beam LR2 is directed through windows (or lenses) into the zone of excitation ZE. The windows adopt a suitable material substantially transparent to the laser beams LR2. The generation of the laser pulses is synchronized with the ejection of the target droplets DP through the nozzle 117. As the target droplets move through the excitation zone, the pre-pulses heat the target droplets and transform them into low-density target plumes. A delay between the pre-pulse and the main pulse is controlled to allow the target plume to form and to expand to an optimal size and geometry. In various embodiments, the pre-pulse and the main pulse have the same pulse-duration and peak power. When the main pulse heats the target plume, a high-temperature plasma plume 23 is generated. The plasma plume 23 emits EUV radiation 29, which is collected by the collector mirror 110. The collector mirror 110, an EUV collector mirror, further reflects and focuses the EUV radiation 29 for the lithography exposing processes performed through the exposure device 200. A droplet DP that does not interact with the laser pulses is captured by the droplet catcher 85. As shown in FIG. 1, the EUV radiation 29 from the collector mirror 110 focuses at the focusing unit 111 between EUV radiation source 100 and the exposure device 200. The EUV radiation 29 that enters from the focusing unit 111 into the exposure device 200 is consistent with EUV radiation that is originated from the focused point, e.g., a point source, in the focusing unit 111.

One method of synchronizing the generation of a pulse (either or both of the pre-pulse and the main pulse) from the excitation laser with the arrival of the target droplet in the zone of excitation is to detect the passage of a target droplet at given position and use it as a signal for triggering an excitation pulse (or pre-pulse). In this method, if, for example, the time of passage of the target droplet is denoted by $t_o$, the time at which EUV radiation is generated (and detected) is denoted by $t_{rad}$, and the distance between the position at which the passage of the target droplet is detected and a center of the zone of excitation is d, the speed of the target droplet, $v_{dp}$, is calculated as $$v_{dp}=d/(t_{rad}-t_o) \qquad \text{equation (1).}$$

Because the droplet generator 115 is expected to reproducibly supply droplets at a fixed speed, once $v_{dp}$ is calculated, the excitation pulse is triggered with a time delay of $d/v_{dp}$ after a target droplet is detected to have passed the given position to ensure that the excitation pulse arrives at the same time as the target droplet reaches the center of the zone of excitation. In some embodiments, because the passage of the target droplet is used to trigger the pre-pulse, the main pulse is triggered following a fixed delay after the pre-pulse. In some embodiments, the value of target droplet speed $v_{dp}$ is periodically recalculated by periodically measuring $t_{rad}$, if needed, and the generation of pulses with the arrival of the target droplets is resynchronized. In some embodiments, the evaporated portion of the droplet DP and the generated plasma is deposited on the inside surface of walls 146 of the chamber of the EUV radiation source 100 and produces deposited debris. As shown in FIG. 1, a blocking shield 204 exists before an opening 148 of the chamber of the EUV radiation source 100. The blocking shield 204 is substantially transparent to EUV radiation but blocks the laser beam LR2 (that is substantially opaque to laser beam LR2) and, thus, prevents the laser beam LR2 to exit the chamber of the EUV radiation source 100. In some embodiments, the deposited debris in the IF cap region 143, defined between the blocking shield 204 and opening 148, reduces the intensity of the generated EUV radiation and reduces the overall efficiency of the EUV radiation source 100. Monitoring the deposited debris in the IF cap region 143 including the blocking shield 204 is described with respect to FIG. 6 below.

Figure 2:
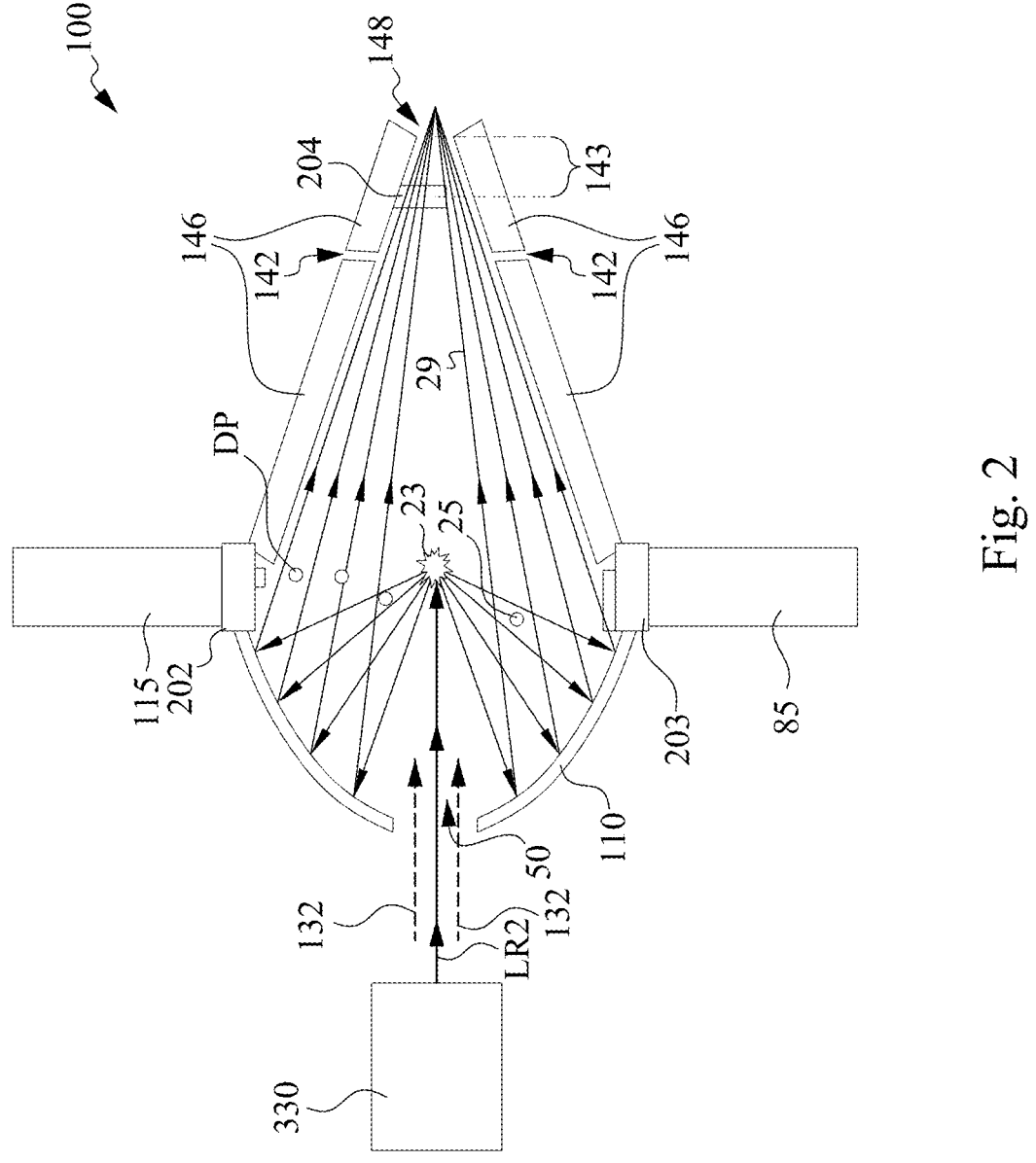
FIG. 2 shows a schematic view of a collector mirror and relating portions of an EUV radiation source for semiconductor manufacturing.

FIG. 2 shows a schematic view of a collector mirror 110 and relating portions of an EUV radiation source 100 for semiconductor manufacturing. In FIG. 2, the EUV radiation source 100 includes the focusing apparatus 330, the collector mirror 110, the droplet generator 115, an aperture 50, and a drain such as the droplet catcher 85, e.g., a tin catcher, for receiving the unreacted tin droplets, e.g., the debris droplet 25. In some embodiments, the aperture 50 is used for the laser beam LR2 of the focusing apparatus 330 and gas flow 132 to enter into the EUV radiation source 100. The walls 146 are used to create a cone shape such that the EUV radiation 29 that stays inside the cone shape exits through the opening 148 and any other radiation that does not stay inside the cone shape does not exit the cone shape and thus does not exit the EUV radiation source 100. In some embodiments, the walls 146 include openings 142 and at least a portion of the gas flow 132 exits through the openings 142 in the walls 146 of the cone shape. The collector mirror 110 is made of a multi-layered mirror including Mo/Si, La/B, La/B₄C, Ru/B₄C, Mo/B₄C, Al₂O₃/B₄C, W/C, Cr/C, and Cr/Sc with a capping layer including SiO₂, Ru, TiO₂, and ZrO₂, in some embodiments. The diameter of the collector mirror 110 can be about 330 mm to about 750 mm depending on the chamber size of the EUV radiation source 100. The cross-sectional shape of the collector mirror 110 can be elliptical or parabolic, in some embodiments.

In some embodiments, an error exists in synchronization between the pulse frequency of the laser beam LR2 and the speed of the ejected tin droplet DP such that when the pulsed laser that is directed to the zone of excitation ZE fires, it misses some droplets and the droplets that have not reached or have already passed the zone of excitation ZE, and thus, become debris droplets 25. A portion of debris droplets 25 may be captured by droplet catcher 85 and another portion of the debris droplets 25 may deposit on the lower-half portion of the reflective surface of the collector mirror 110. The deposited debris on the collector mirror 110 may deteriorate the reflective property of the collector mirror 110, thereby lowering the power of EUV radiation source 100 for EUV photolithography. In some embodiments, as noted above, the deposited debris in the IF cap region 143 next to the opening 148 reduces the overall efficiency of the EUV radiation source 100 and, thus, is monitored as described below with respect to FIG. 6. As shown in FIG. 2, the droplet generator 115 is attached to the chamber the EUV radiation source 100 through an opening of an input port 202 and the droplet catcher 85 is attached to the chamber the EUV radiation source 100 through an opening of an input port 203. In some embodiments, as shown in FIGS. 1 and 2, the EUV radiation 29 is directed through the opening 148 to focus in the focusing unit 111 attached to the opening 148. The IF cap region 143 is defined between the blocking shield 204 and opening 148 in some embodiments.

Figures 3A, 3B:
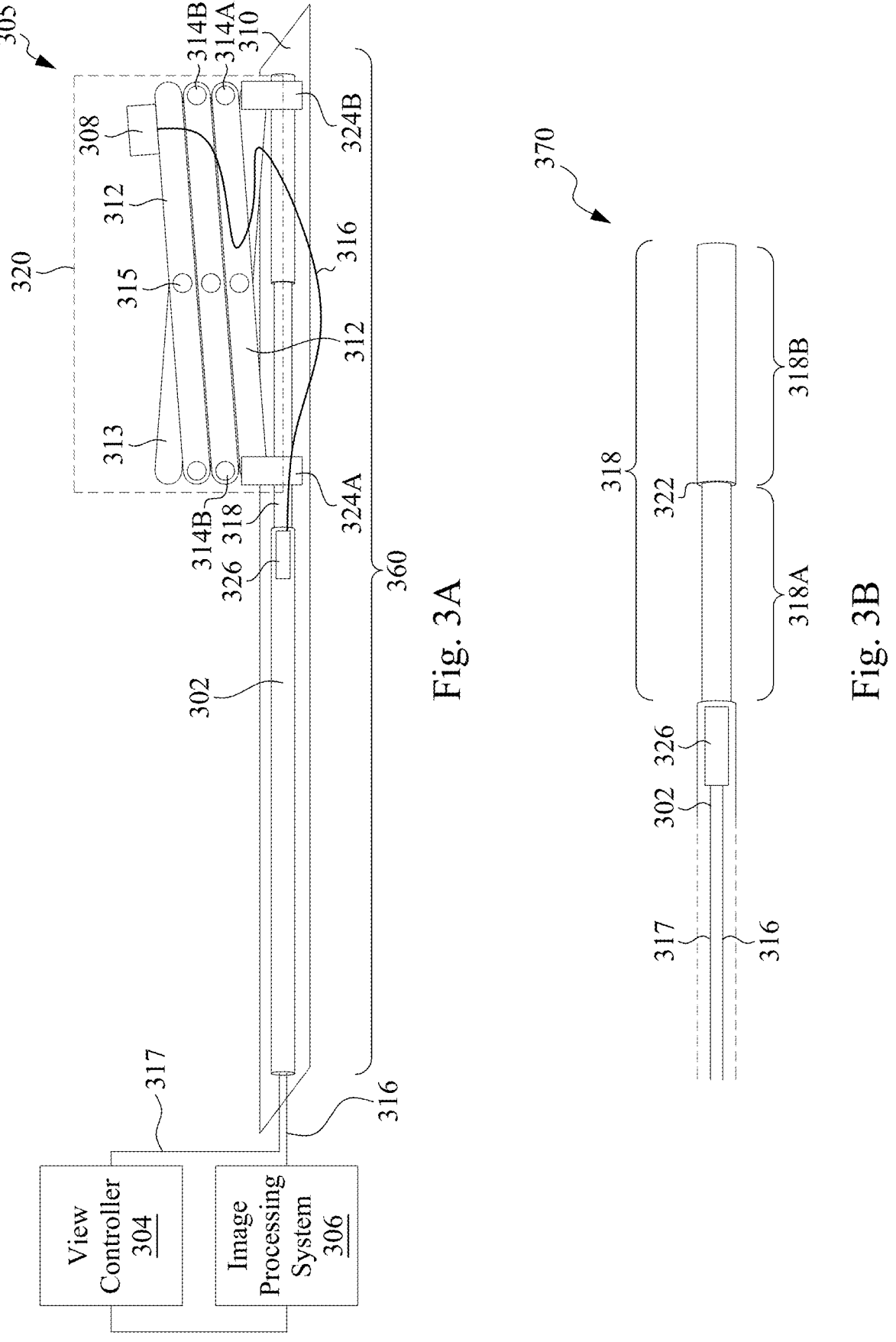
FIGS. 3A and 3B show an observation system for inspecting inside a chamber of an EUV radiation source for semiconductor manufacturing and a lead screw assembly in accordance with some embodiments of the present disclosure.

FIGS. 3A and 3B show an observation system 305 for inspecting inside a chamber of an EUV radiation source 100 for semiconductor manufacturing and a lead screw assembly 370 in accordance with some embodiments of the present disclosure. The observation system 305 includes a fixture 360. The fixture 360 includes a flatbed 310 with a conduit 302, e.g., a tube, mounted on the flatbed 310. An electrical motor 326 is mounted at one end of the conduit 302. The electrical motor 326 is mechanically connected to a lead screw 318 such that the electrical motor 326 may rotate the lead screw either clockwise or counter clockwise. The observation system 305 also includes a view controller 304 that is connected to the electrical motor 326 via a connection cable 317. In some embodiments, the view controller 304 exerts power and control signals to the electrical motor 326 and controls the speed, direction of rotation, and amount of rotation of the electrical motor 326 and lead screw 318.

As shown in FIG. 3A, the fixture 360 also includes an extendible section 320, with a pantograph shape, in a folded position, that includes first and second zigzag portions. The first zigzag portion includes two or more segments 312 that are connected by hinges 314A and the second zigzag portion includes two or more segments 313 that are connected by hinges 314B. The first and second zigzag portions are connected to each other by hinges 315. The first zigzag portion is mounted by a base 324A on the lead screw 318, and the base 324A includes a nut that may rotate on the lead screw 318 and may move on the lead screw 318 when the lead screw rotates. Similarly, the second zigzag portion is mounted by a base 324B on the lead screw 318, and the base 324B includes a nut that may rotate on the lead screw 318 and may move on the lead screw 318 when the lead screw rotates. Thus, as shown, the extendible section 320 is mounted from one side via the bases 324A and 324B on the lead screw 318.

The fixture 360 also includes a camera assembly 308 attached to one end of a connection cable 316. In some embodiments, the camera assembly 308 and the connection cable 316 are elements of a borescope. In some embodiments, as shown, the camera assembly 308 is mounted at one end of segment 312 of the first zigzag portion. The observation system 305 also includes an image processing system 306 that is connected to the camera assembly 308 via the connection cable 316. In some embodiments, the connection cables 316 and 317 transfer signal, power, and data in both directions. In some embodiments, the connection cables 316 and 317 include a fiber optics cable for transferring data and signal. In some embodiments, the connection cables 316 and 317 include a conductive cable for transferring power, data, and signal. In some embodiments, the view controller 304 commands the camera assembly 308 through the image processing system 306 and via the connection cable 316 to capture one or more images from inside the chamber of the EUV radiation source 100. In some embodiments, the captured images are transferred through the connection cable 316 to the image processing system 306. In some embodiments, the image processing system 306 analyzes the captured images to determine the amount of metal debris, e.g., tin debris, that is deposited inside the chamber of the EUV radiation source 100. The lead screw 318 at a front portion 350 of the fixture 360 is described with respect to FIG. 3B.

FIG. 3B shows the lead screw 318 and a portion of the conduit 302 that is part of the front portion 350 of the fixture 360. FIG. 3B shows the lead screw 318, a portion of the conduit 302, the electrical motor 326, and the connection cables 316 and 317. The lead screw 318 has two different but connected portions. The lead screw 318 includes a first right-handed portion 318A and a second left-handed portion 318B that are connected at midpoint 322. In some embodiments, the lead screw rotates in a first direction, e.g., clockwise, and the first and second bases 324A and 324B separate from each other and provides the extendible section 320 in the folded position. In some embodiments, the lead screw rotates in a second direction, e.g., counter clockwise, opposite to the first direction, and the first and second bases 324A and 324B get close to the midpoint 322 and provides the extendible section 425 of FIG. 4A in an extended position, e.g., stretched position.

Figures 4A, 4B:
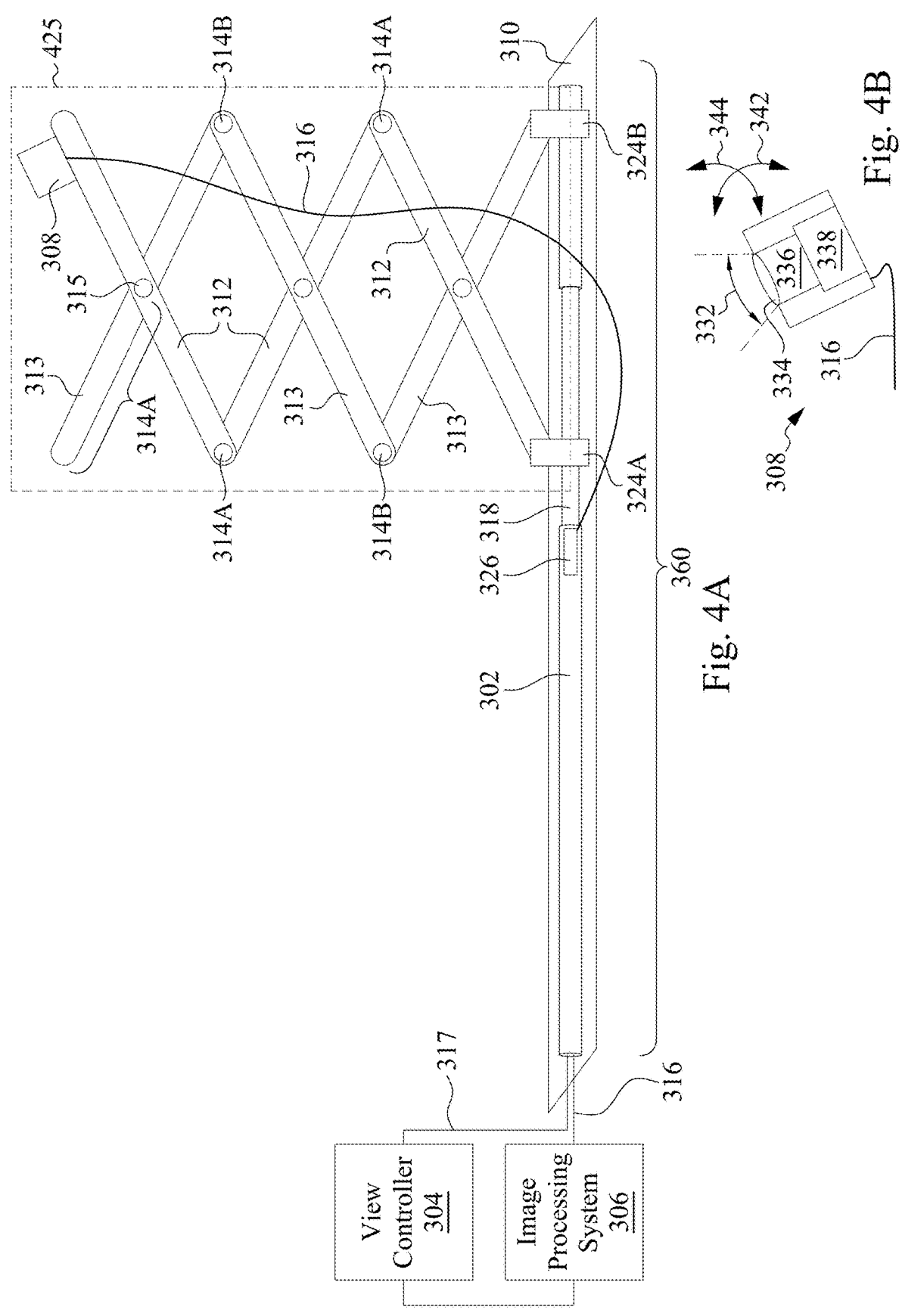
FIGS. 4A and 4B show an observation system for inspecting inside a chamber of an EUV radiation source for semiconductor manufacturing and a camera assembly in accordance with some embodiments of the present disclosure.

FIGS. 4A and 4B show an observation system 400 for inspecting inside a chamber of an EUV radiation source for semiconductor manufacturing and a camera assembly 308 in accordance with some embodiments of the present disclosure. The observation system 400 of FIG. 4A is consistent with the observation system 305 of FIG. 3A with the difference that in the observation system 400 the lead screw 318 is rotated such that the first and second bases 324A and 324B are closer than the observation system 305 to the midpoint 322 and, thus, the extendible section 425 of FIG. 4A is in the extended position. In some embodiments, the end segment 313, the segment farther from the lead screw of the second zigzag portion, e.g., the partial segment 313A is removed. In some embodiments, removing the partial segment 313A allows the camera assembly 308 to move beyond the blocking shield 204 and capture images of the IF cap region 143.

FIG. 4B shows the camera assembly 308 that can be mounted on one side of the extendible section 425 that is farther from the lead screw. The camera assembly 308 includes a camera 336 that includes a lens 334. The camera assembly 308 is mounted on an electrical motor 338 that is mechanically coupled to the camera 336 and is designed to move the camera in two different and perpendicular directions, e.g., up-down direction 342 and right-left direction 344. In some embodiments, by moving the camera a viewing angle 332 of the camera 336 changes, and different views of the chamber of the EUV radiation source 100 at different locations of the chamber of the EUV radiation source 100 are imaged. In some embodiments, the connection cable 316 includes a conductive cable that provides power and signal to the camera 336.

Figure 5:
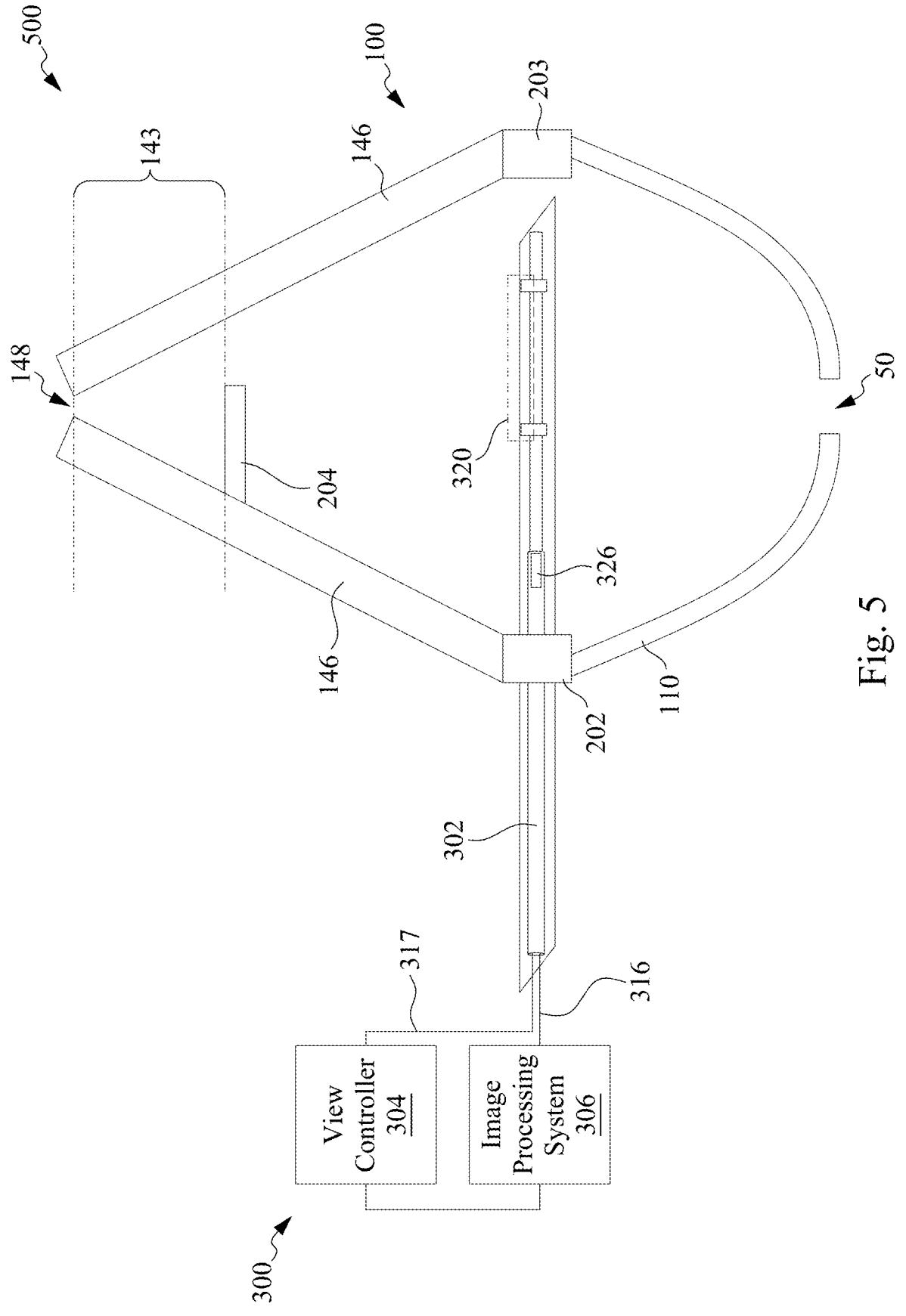
FIG. 5 shows an inspecting system of an EUV radiation source with an observation systems partially inserted inside the chamber of the EUV radiation source for semiconductor manufacturing in accordance with some embodiments of the present disclosure.

FIG. 5 shows an inspecting system 500 of an EUV radiation source 100 with the observation system 305 partially inserted inside the chamber of the EUV radiation source for semiconductor manufacturing in accordance with some embodiments of the present disclosure. As shown in FIG. 5, the front portion 350 of the fixture 360 of the observation system 305 is inserted in the chamber of the EUV radiation source. In some embodiments, the EUV radiation source 100 or the EUV lithography system is in the idle mode or in the preventive maintenance mode and, thus, the LR2 laser beam is turned off, no target droplets DP are introduced into the chamber of the EUV radiation source 100, and no EUV radiation is generated. In some embodiments, during an idle mode or during a preventive maintenance mode, the droplet generator 115 of the EUV radiation source 100 is manually detached from the input port 202 and an opening is produced in the chamber of the EUV radiation source 100 where the input port 202 is attached to the chamber. After detaching the droplet generator 115, the observation system 305, with the extendible section 320 in the folded position, is manually inserted inside the chamber of the EUV radiation source 100 through the opening of the input port 202. As shown, the view controller 304 and the image processing system 306 that are outside the chamber of the EUV radiation source 100 are connected through the respective connection cable 317 and 316 to the fixture 360 and may control the fixture 360. In some embodiments, during an idle mode or during a preventive maintenance mode, the droplet catcher 85 of the EUV radiation source 100 is manually detached from the input port 203 and an opening is produced in the chamber of the EUV radiation source 100 where the input port 203 is attached to the chamber and the front portion 350 of the fixture 360 may be introduced into the chamber of EUV radiation source 100 through the opening of the input port 203. In some embodiments, a cross-section of the input port 202 at the droplet generator side has a width between about 2 cm and about 4 cm and a height between about 5 cm and about 7 cm. In some embodiments, the flatbed 310 has a width between about 1.5 cm and about 3.5 cm and a length between about 30 cm and about 60 cm. In some embodiments, the extendible section 320, when folded, has a width between about 1.5 cm and about 3.5 cm, a length between about 20 cm and about 30 cm, and a height between about 4 cm and about 6 cm. In some embodiments, a width of a cross-section of the input port 203 is between about 15 cm and about 20 cm.

Figure 6:
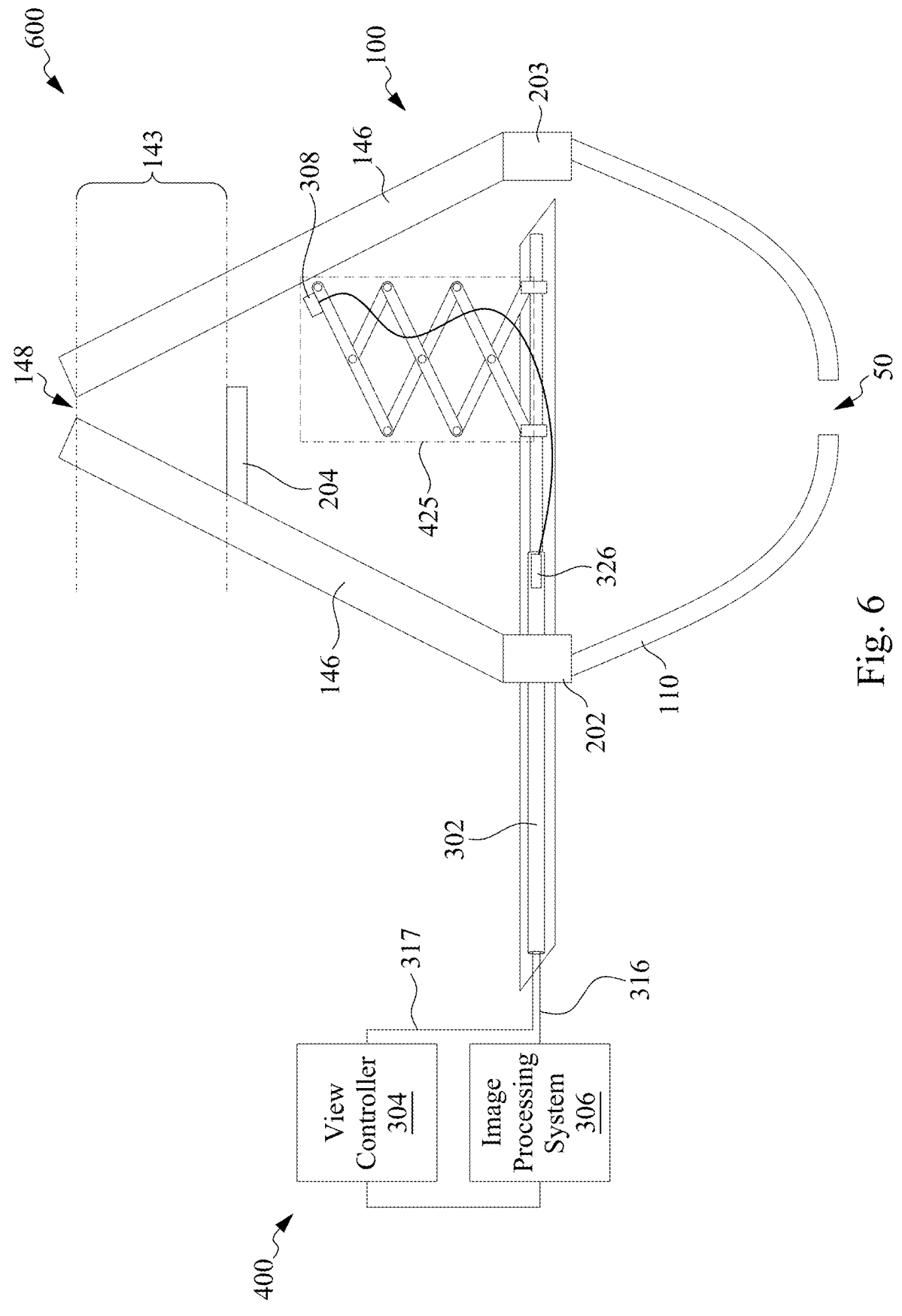
FIG. 6 shows an inspecting system an EUV radiation source with an observation systems partially inserted inside the chamber of the EUV radiation source for semiconductor manufacturing in accordance with some embodiments of the present disclosure.

FIG. 6 shows an inspecting system 600 of an EUV radiation source 100 with an observation systems 400 partially inserted inside the chamber of the EUV radiation source for semiconductor manufacturing in accordance with some embodiments of the present disclosure. FIG. 6 is consistent with FIG. 5 with the difference that the extendible section 425 is in the extended position and camera assembly 308 is near the blocking shield 204. As described above, in some embodiments, the front portion 350 of the fixture 360 of the observation system 305 is introduced into the chamber of the EUV radiation source 100 through the openings of the input port 202 or the input port 203 when the extendible section 320 in the folded position. In some embodiments, the view controller 304 sends command signals through the connection able 317 to the electrical motor 326 to rotate lead screw 318 and to move the camera assembly 308 near the blocking shield 204. In some embodiments, while the lead screw 318 is rotating and the extendible section 425 is extending, the view controller 304 commands the image processing system 306 to receive the images acquired by the camera assembly 308 via the connection cable 316. The image processing system 306 may analyze the acquired images to determine the location of the camera assembly 308. Based on the determined location of the camera assembly 308, the image processing system 306 may send appropriate commands related to extending the extendible section 425 to the view controller 304. In some embodiments, the image processing system 306 may send commands to the view controller 304 to slow or stop extending the extendible section 425. As shown in FIG. 6, the extendible section 425 does not have the partial segment 313A of the second zigzag portion and, thus, the camera assembly 308 may extend above the blocking shield 204 and capture image of the IF cap region 143, the opening 148, and the surfaces of the blocking shield 204. In some embodiments, commands are sent to the electrical motor 338, either from the view controller 304 via the image processing system 306 or directly from the image processing system 306, to rotate the camera 336 in the up-down direction 342 and/or in the left-right direction 344 to acquire the images at different viewing angles 332. In some embodiments, the camera assembly 308 includes a supersonic transmitter and detector 309 that transmits sound waves in frequencies between about 50 kHz and 100 kHz. The supersonic transmitter and detector 309 may also detect the received sound waves. In some embodiments, the camera assembly 308 transmits the sound waves at different locations of the IF cap region 143. In some embodiments, the detect signal of the received sound waves is transmitted via the connection able 317 or 316 to the view controller 304 or image processing system 306. In some embodiments, based on the frequency content of the detected signal, the view controller 304 or image processing system 306 may determine amount of metal debris deposited on the IF cap region 143.

Figure 7:
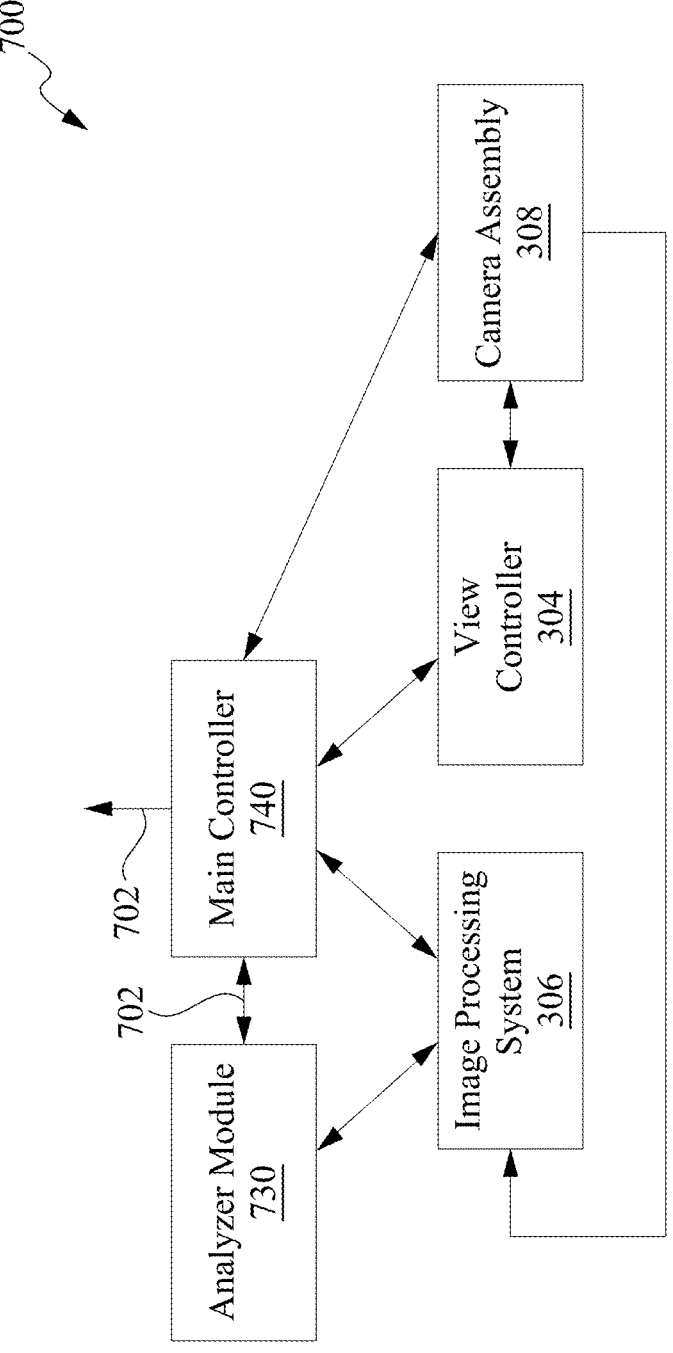
FIG. 7 shows a control system for inspecting inside the chamber of the EUV radiation source for semiconductor manufacturing in accordance with some embodiments of the present disclosure.

FIG. 7 shows a control system 700 for inspecting inside the chamber of the EUV radiation source for semiconductor manufacturing in accordance with some embodiments of the present disclosure. The control system 700 includes an analyzer module 730 and a main controller 740 coupled to each other. In some embodiments, the control system 700 includes the image processing system 306 of FIG. 3A, 4A, 5, or 6, the view controller 304 of FIG. 3A, 4A, 5, or 6, and the camera assembly 308 of FIGS. 3A and 4B. In some embodiments, the main controller 740 directly controls the camera assembly 308. In some embodiments, the main controller 740 indirectly controls the camera assembly 308 via the view controller 304. In some embodiments, the image processing system 306 directly receives the captured images of the IF cap region 143 from the camera assembly 308. In some embodiments, the image processing system 306 receives the captured images of the IF cap region 143 from the camera assembly 308 through the main controller 740 and the image processing system 306 transfers the captured images of the IF cap region 143 to the analyzer module 730.

In some embodiments, the analyzer module 730 determines, based on the captured images of the IF cap region 143, whether a cleaning of the chamber of the EUV radiation source 100 is required. The analyzer module 730 generates a signal 702 that indicates if the cleaning of the chamber of the EUV radiation source 100 is required and sends the signal 702 to the main controller 740 and the main controller provides the signal 702 as an output signal. In some embodiments, the main controller 740 commands the view controller 304 to move the camera assembly 308 to different positions in of the IF cap region 143 and capture the images from different positions of the IF cap region 143. In some embodiments, the images of the IF cap region 143 are captured during an idle time of the EUV radiation source 100 or during a preventive maintenance time of the lithography system. In some embodiments, the main controller 740 commands the image processing system 306 or the view controller 304 to rotate the camera assembly 308 in the up-down direction and/or in the left-right direction to take the captured images from different viewing angles of the IF cap region 143.

FIG. 8 shows a process 800 for inspecting inside the chamber of the EUV radiation source 100 for semiconductor manufacturing in accordance with some embodiments of the present disclosure. The process 800 or a portion of the process 800 may be performed by the system of FIG. 7. In some embodiments, the process 800 or a portion of the process 800 is performed and/or is controlled by the computer system 900 described below with respect to FIGS. 9A and 9B. In some embodiments, the process 800 or a portion of the process 800 is performed by the control system 700 of FIG. 7 described above. The method includes an operation S802, where a borescope mounted on a fixture is inserted through a first opening into a chamber of an EUV radiation source. The fixture includes an extendible section and the borescope includes a camera that is mounted on the fixture. As shown in FIGS. 3A and 5, a front portion 350 of the observation system 305 is inserted through the opening of the input port 202 inside the chamber of the EUV radiation source 100. The front portion 350 is part of a fixture 360 with an extendible section 320 and the borescope that includes the camera assembly 308 and the connection cable 316. As shown, the camera assembly 308 is mounted on the extendible section 320 of the fixture 360.

In operation S804, the extendible section is stretched such that the camera inside the chamber of the EUV radiation source is moved. As shown in FIG. 4A, the extendible section 320 of the fixture 360 is stretched to become the extendible section 425 of the fixture 360. As shown in FIGS. 5 and 6, the extendible section 425 of the fixture 360 is stretched and the camera assembly 308 gets closer to the blocking shield 204.

In operation S806, one or more images are acquired by the camera from inside the chamber of the EUV radiation source at one or more viewing positions. As shown in FIG. 6, the image processing system or the view controller commands the camera assembly 308 to capture one or more images of inside the chamber of the EUV radiation source 100 when the camera assembly 308 is at different locations, e.g., positions, along the direction of movement of the camera assembly 308 during stretching of the extendible section 425. In some embodiments, the images are captured when the camera assembly 308 is in the IF cap region 143 or is moving in the IF cap region 143.

In operation S808, the one or more acquired images are analyzed to determine an amount of tin debris deposited inside the chamber of the EUV radiation source. As described, the captured images are sent to the analyzer module 730 to be analyzed by the analyzer module 730 and to determine the amount of debris that is deposited the chamber of the EUV radiation source 100. In some embodiments, the analyzer module 730 determines the amount of debris that is deposited in the IF cap region 143. In some embodiments, based on the amount of debris that is deposited in the IF cap region 143, the analyzer module 730 determines if a cleaning of the IF cap region 143 is required. In some embodiments, if based on the analysis of the captured images the analyzer module 730 determines that a surface area of the opening 148 is blocked by more than a threshold value of 15 percent, the signal 702 is generated by the analyzer module 730 that the cleaning of the IF cap region 143 or the cleaning of the EUV radiation source 100 is required. In some embodiments, if based on the analysis of the captured images the analyzer module 730 determines that the chamber walls in the IF cap region and the surfaces of the blocking shield 204 that are covered by the metal debris, e.g., tin debris, are more than a threshold value of 25 percent, the signal 702 is generated by the analyzer module 730 that the cleaning of the IF cap region 143 or the cleaning of the EUV radiation source 100 is required. In some embodiments, after a cleaning the clean images of the IF cap region are acquired. The acquired images during the idle mode or the maintenance mode may be compared by the original images, e.g., using an artificial algorithm, to determine what percentage of the IF cap region is covered.

Figures 9A, 9B:
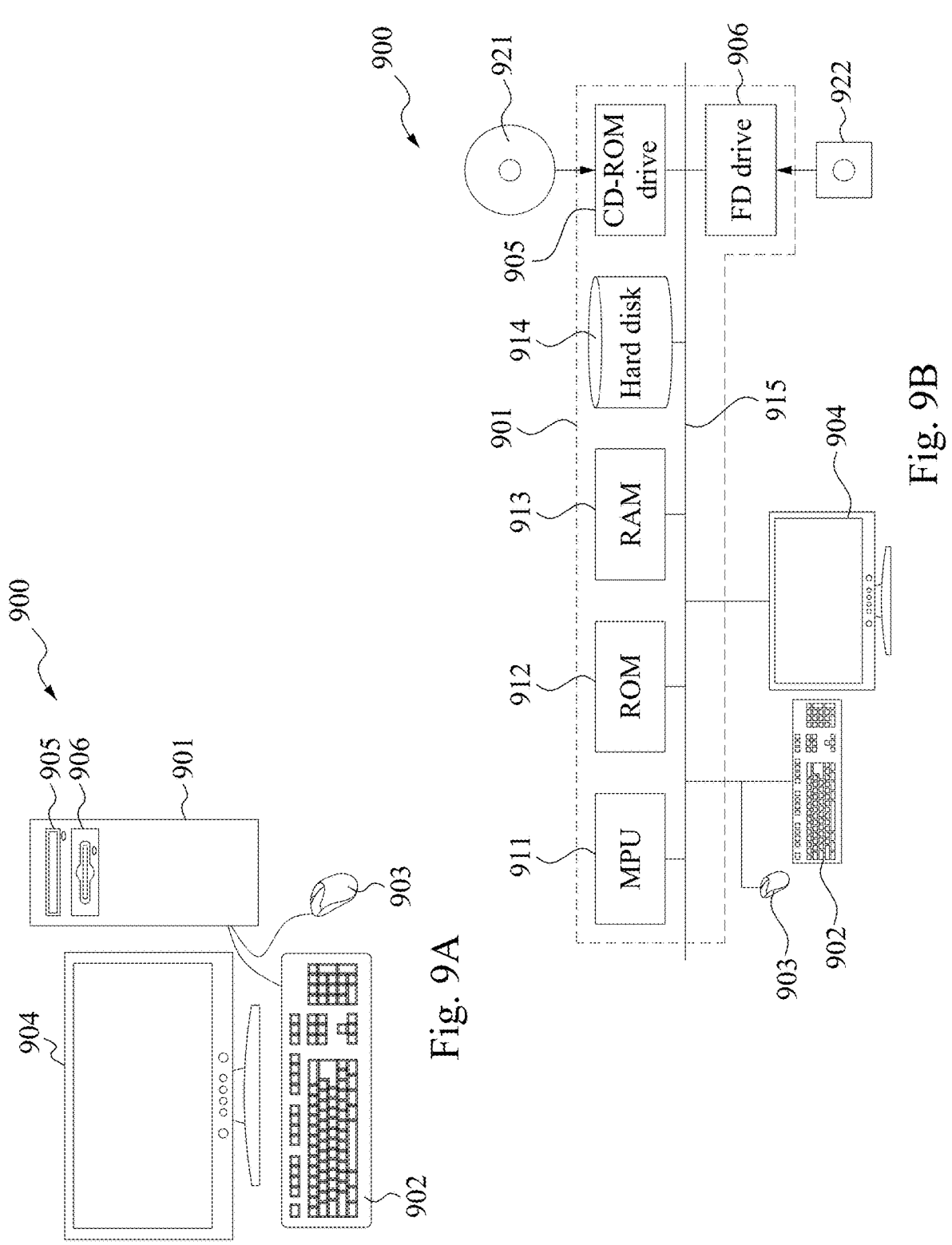
FIGS. 9A and 9B illustrate an apparatus for inspecting inside the chamber of the EUV radiation source for semiconductor manufacturing in accordance with some embodiments of the present disclosure.

FIGS. 9A and 9B illustrate an apparatus for inspecting inside the chamber of the EUV radiation source 100 for semiconductor manufacturing in accordance with some embodiments of the present disclosure. In some embodiments, the computer system 900 is used for performing the functions of the modules of FIG. 7 that includes the main controller 740, the analyzer module 730, the view controller 304, and the image processing system 306. In some embodiments, the computer system 900 is used to execute the process 800 of FIG. 8.

FIG. 9A is a schematic view of a computer system that performs the functions of an apparatus for inspecting inside the chamber of the EUV radiation source 100 for semiconductor manufacturing. All of or a part of the processes, method and/or operations of the foregoing embodiments can be realized using computer hardware and computer programs executed thereon. In FIG. 9A, a computer system 900 is provided with a computer 901 including an optical disk read only memory (e.g., CD-ROM or DVD-ROM) drive 905 and a magnetic disk drive 906, a keyboard 902, a mouse 903, and a monitor 904.

FIG. 9B is a diagram showing an internal configuration of the computer system 900. In FIG. 9B, the computer 901 is provided with, in addition to the optical disk drive 905 and the magnetic disk drive 906, one or more processors, such as a micro processing unit (MPU) 911, a ROM 912 in which a program such as a boot up program is stored, a random access memory (RAM) 913 that is connected to the MPU 911 and in which a command of an application program is temporarily stored and a temporary storage area is provided, a hard disk 914 in which an application program, a system program, and data are stored, and a bus 915 that connects the MPU 911, the ROM 912, and the like. Note that the computer 901 may include a network card (not shown) for providing a connection to a LAN.

The program for causing the computer system 900 to execute the functions of the control system for inspecting inside the chamber of the EUV radiation source 100 in the foregoing embodiments may be stored in an optical disk 921 or a magnetic disk 922, which are inserted into the optical disk drive 905 or the magnetic disk drive 906, and transmitted to the hard disk 914. Alternatively, the program may be transmitted via a network (not shown) to the computer 901 and stored in the hard disk 914. At the time of execution, the program is loaded into the RAM 913. The program may be loaded from the optical disk 921 or the magnetic disk 922, or directly from a network. The program does not necessarily have to include, for example, an operating system (OS) or a third party program to cause the computer 901 to execute the functions of the control system for inspecting inside the chamber of the EUV radiation source 100 in the foregoing embodiments. The program may only include a command portion to call an appropriate function (module) in a controlled mode and obtain desired results.

According to some embodiments of the present disclosure, a method of inspecting an extreme ultraviolet (EUV) radiation source, in an idle mode of the EUV radiation source, includes inserting a borescope mounted on a fixture through a first opening into a chamber of the EUV radiation source. The borescope includes a connection cable attached at a first end to a camera. The fixture includes an extendible section mounted from a first side of the extendible section on a lead screw, and the camera of the borescope is mounted on a second side, opposite to the first side, of the extendible section. The method also includes extending the extendible section to move the camera inside the chamber of the EUV radiation source and acquiring one or more images by the camera from inside the chamber of the EUV radiation source at one or more viewing positions. The method further includes analyzing the one or more acquired images to determine an amount of tin debris deposited inside the chamber of the EUV radiation source. In an embodiment, the EUV radiation source includes an excitation laser that generates a light beam that focuses onto tin droplets to generate EUV radiation inside the chamber of the EUV radiation source. The EUV radiation generated inside the EUV radiation source exits the chamber of the EUV radiation source through a second opening of the chamber of the EUV radiation source. Inside the chamber of the EUV radiation source, a blocking shield prevents the light beam of the excitation laser to escape from the second opening of the EUV radiation source, the method further includes extending the extendible section, in a direction toward the second opening of the EUV radiation source, to move the camera beyond the blocking shield and acquiring the one or more images from a region beyond the blocking shield. In an embodiment, the method further includes acquiring the one or more images from an intermediate focus (IF) cap region that includes the second opening of the EUV radiation source and a region of the chamber of the EUV radiation source between the second opening of the EUV radiation source and the blocking shield. In an embodiment, the method further includes comparing the amount of tin debris deposited in the IF cap region with a cleaning threshold and generating a signal to clean the EUV radiation source, if the deposited amount of tin debris exceeds the cleaning threshold. In an embodiment, the method further includes rotating the lead screw to extend the extendable section and to move the camera beyond the blocking shield. In an embodiment, the EUV radiation source includes an image processing system attached to a second end of the connection cable, the method further includes transferring the acquired one or more images of the camera through the connection cable to the image processing system. In an embodiment, the EUV radiation source includes a droplet generator that introduces the tin droplets into the chamber of the EUV radiation source and a droplet catcher that collects unused tin droplets and tin debris from the chamber of the EUV radiation source. In the idle mode, one of the droplet catchers or the droplet generator is detached to produce the first opening in a wall of the chamber of the EUV radiation source.

According to some embodiments of the present disclosure, in a method of inspecting an extreme ultraviolet (EUV) radiation source, the EUV radiation source includes a droplet generator for introducing tin droplets into a chamber of the EUV radiation source, a droplet catcher for collecting unused tin droplets and tin debris from the chamber of the EUV radiation source, and an excitation laser for generating a light beam to focus onto the tin droplets to generate EUV radiation. The droplet generator is detached from the chamber of the EUV radiation source to produce a first opening in a wall of the chamber of the EUV radiation source, in an idle mode of the EUV radiation source, the method includes inserting a camera mounted on a fixture through the first opening into the EUV radiation source. The camera is attached to a first end of a connection cable. The fixture includes an extendible section mounted from a first side of the extendible section on a lead screw, and the camera is mounted to a second side of the extendible section. The method also includes rotating the lead screw to extend the extendible section and to move the camera inside a chamber of the EUV radiation source. The method further includes acquiring one or more images by the camera from inside the chamber of the EUV radiation source at one or more viewing positions and analyzing the one or more acquired images to determine an amount of tin debris deposited inside the chamber of the EUV radiation source. In an embodiment, the fixture includes two zigzag portions hinged to each other. The two zigzag portions are mounted via first and second bases to the lead screw, the method further includes rotating the lead screw in a first direction to separate the first and second bases from each other thereby to shorten the extendible section, and rotating the lead screw in a second direction opposite to the first direction to bring the first and second bases closer to each other thereby to lengthen the extendible section. In an embodiment, inside the chamber of the EUV radiation source includes a blocking shield in front of the light beam to prevent the light beam of the excitation laser to reach a second opening of the EUV radiation source, and the EUV radiation generated inside the EUV radiation source exits the chamber of the EUV radiation source through the second opening, the method further includes extending the extendible section, in a direction toward the second opening, to move the camera beyond the blocking shield, and acquiring the one or more images from a region beyond the blocking shield. In an embodiment, the method further includes acquiring the one or more images from an intermediate focus (IF) cap region of the chamber the EUV radiation source between the second opening and the blocking shield. In an embodiment, the connection cable includes a fiber optics cable. The EUV radiation source further includes an image processing system attached to a second end of the fiber optics cable, the method further includes transferring the acquired one or more images of the camera through the fiber optics cable to the image processing system. In an embodiment, the method further includes comparing, by the image processing system, the amount of tin debris deposited in the IF cap region with a cleaning threshold, and generating, by the image processing system, a signal to clean the EUV radiation source, if the deposited amount of tin debris exceeds the cleaning threshold. In an embodiment, EUV radiation source further includes a first motor coupled to the lead screw and a view controller coupled to the first motor to control the first motor. The camera is mounted in a holder that includes a second motor that controls up-down and left-right motion of the camera, the method further includes controlling the one or more viewing positions of the camera by the view controller through the first motor, and controlling viewing angle of the camera by controlling the second motor via the image processing system.

According to some embodiments of the present disclosure, a system for inspecting an extreme ultraviolet (EUV) radiation source includes a main controller and an analyzer module coupled to the main controller. The system includes an extreme ultraviolet (EUV) radiation source that includes a chamber having a cone shape, a first opening of the chamber to connect a droplet generator to introduce tin droplets into the chamber, a second opening of the chamber to connect a droplet catcher to collect tin debris, an excitation laser for generating a light beam that to focus onto the tin droplets to generate EUV radiation, a collecting mirror for directing the EUV radiation toward a third opening, and a blocking shield between the third opening and the collecting mirror to substantially block the light beam from exiting the chamber through the third opening. The system also includes an observation system that includes a flat elongated surface, a lead screw mounted on the flat elongated surface, a first motor mechanically coupled to the lead screw to rotate the lead screw, a view controller coupled to the first motor and for controlling the rotation of the lead screw, a fixture that includes an extendible section mounted from a first side of the extendible section on the lead screw, a camera assembly mounted on a first end of a fiber optics cable and the camera assembly is mounted on a second side, opposite to the first side, of the extendible section, and an image processing system coupled through a second end, opposite the first end, to the fiber optics cable. The main controller commands the view controller to move the camera assembly inside the chamber beyond the blocking shield and commands the image processing system to acquire one or more images from a region beyond the blocking shield. In an embodiment, the main controller commands the image processing system to send the one or more images to the analyzer module, and the analyzer module to analyze the acquired one or more images to determine an amount of tin debris deposited inside the chamber of the EUV radiation source in the region beyond the blocking shield. In an embodiment, the lead screw of the observation system has two sections, a first right-handed section and a second left-handed section. The extendible section is mounted via a first base including a rotatable bolt on the first right-handed section, and a second base including a rotatable bolt on the second left-handed section. The main controller commands the view controller to rotate the lead screw in a first direction to separate the first and second bases from each other thereby to shorten the extendible section, and commands the view controller to rotate the lead screw in a second direction opposite to the first direction to bring the first and second bases closer to each other thereby to lengthen the extendible section. In an embodiment, the camera assembly includes a camera and a second motor, the main controller commands the second motor via the view controller or the image processing system to change a viewing angle of the camera. In an embodiment, the main controller commands the view controller to rotate the lead screw to move the camera assembly to acquire one or more images by the camera assembly from inside the chamber of the EUV radiation source at one or more viewing positions. In an embodiment, the first and second motors are step motors. The main controller commands the image processing system to acquire one or more images from an intermediate focus (IF) cap region that comprises a region of the chamber of the EUV radiation source between the third opening and the blocking shield and to send the acquired one or more images to the analyzer module. The main controller commands the analyzer module to determine an amount of tin debris deposited in the IF cap region, to compare the amount of tin debris deposited in the IF cap region with a cleaning threshold, and to generate a signal to clean the EUV radiation source if the deposited amount of tin debris exceeds the cleaning threshold.

As described in the foregoing embodiments, because of the blocking shield the cameras mounted near the zone of excitation cannot acquire an image of the IF cap region. In addition, the metal debris deposited in the IF cap region may reduce the intensity of the generated EUV radiation and change the direction of the generated EUV radiation and may reduce the overall EUV conversion efficiency. As described above, by acquiring images from the IF cap region, the amount of metal debris deposited in the IF cap region may be determined and when the EUV radiation source needs cleaning is determined.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of inspecting an extreme ultraviolet (EUV) radiation source of a semiconductor manufacturing system, comprising, in an idle mode of the EUV radiation source:

inserting a borescope mounted on a fixture through a first opening into a chamber of the EUV radiation source, wherein the borescope comprises a connection cable attached at a first end to a camera, wherein the fixture comprises an extendible section mounted from a first side of the extendible section, and wherein the camera of the borescope is mounted on a second side, opposite to the first side, of the extendible section, wherein:

the EUV radiation source comprises an excitation laser that generates a light beam that is configured to focus onto tin droplets to generate EUV radiation inside the chamber of the EUV radiation source, wherein the EUV radiation generated inside the EUV radiation source exits the chamber of the EUV radiation source through a second opening of the chamber of the EUV radiation source, and wherein inside the chamber of the EUV radiation source comprises a blocking shield that is configured to prevent the light beam of the excitation laser from escaping from the second opening of the EUV radiation source;

extending the extendible section, in a direction toward the second opening of the EUV radiation source, to move the camera beyond the blocking shield;

acquiring one or more images from a region beyond the blocking shield; and analyzing the one or more acquired images to determine an amount of tin debris deposited inside the chamber of the EUV radiation source.

2. The method of claim 1, wherein the extendible section includes a pantograph structure.

3. The method of claim 1, further comprising:

acquiring the one or more images from an intermediate focus (IF) cap region that comprises the second opening of the EUV radiation source and a region of the chamber of the EUV radiation source between the second opening of the EUV radiation source and the blocking shield.

4. The method of claim 3, further comprising:

comparing the amount of tin debris deposited in the IF cap region with a cleaning threshold; and generating a signal to clean the EUV radiation source if the deposited amount of tin debris exceeds the cleaning threshold.

5. The method of claim 1, further comprising:

rotating a lead screw to extend the extendible section and to move the camera beyond the blocking shield, wherein the extendible section is mounted to the first side of the extendible section on the lead screw.

6. The method of claim 1, wherein the EUV radiation source comprises an image processing system attached to a second end of the connection cable, and the method further comprises transferring the acquired one or more images of the camera through the connection cable to the image processing system.

7. The method of claim 1, wherein the EUV radiation source comprises a droplet generator that introduces the tin droplets into the chamber of the EUV radiation source and a droplet catcher that collects unused tin droplets and tin debris from the chamber of the EUV radiation source, and wherein in the idle mode one of the droplet catcher or the droplet generator is detached to produce the first opening in a wall of the chamber of the EUV radiation source.

8. A method of inspecting an extreme ultraviolet (EUV) radiation source of a semiconductor manufacturing system, wherein the EUV radiation source comprises a droplet generator for introducing tin droplets into a chamber of the EUV radiation source, a droplet catcher for collecting unused tin droplets and tin debris from the chamber of the EUV radiation source, and an excitation laser for generating a light beam that is configured to focus onto the tin droplets to generate EUV radiation, and wherein the droplet generator is detached from the chamber of the EUV radiation source to produce a first opening in a wall of the chamber of the EUV radiation source, wherein the EUV radiation source comprises a blocking shield configured to block the light beam of the excitation laser and be transparent to the EUV radiation, the method comprising, in an idle mode of the EUV radiation source:

inserting a camera mounted on a fixture through the first opening into the EUV radiation source, wherein the camera is attached to a first end of a connection cable, wherein the fixture comprises an extendible section mounted to a first side of the extendible section on a lead screw, and wherein the camera is mounted to a second side of the extendible section;

rotating the lead screw to extend the extendible section and to move the camera inside a chamber of the EUV radiation source;

extending the extendible section to move the camera beyond the blocking shield;

acquiring one or more images by the camera from a region beyond the blocking shield inside the chamber of the EUV radiation source at one or more viewing positions; and analyzing the one or more acquired images to determine an amount of tin debris deposited inside the chamber of the EUV radiation source.

9. The method of claim 8, wherein the fixture comprises two zigzag portions hinged to each other, wherein the two zigzag portions are mounted via first and second bases to the lead screw, and wherein the method further comprises:

rotating the lead screw in a first direction to separate the first and second bases from each other thereby to shorten the extendible section; and rotating the lead screw in a second direction opposite to the first direction to bring the first and second bases closer to each other thereby to lengthen the extendible section.

10. The method of claim 8, wherein the extendible section includes a pantograph structure.

11. The method of claim 8, further comprising acquiring the one or more images from an intermediate focus (IF) cap region of the chamber of the EUV radiation source between a second opening of the EUV radiation source and the blocking shield, wherein the EUV radiation generated inside the EUV radiation source exits the chamber of the EUV radiation source through the second opening.

12. The method of claim 11, wherein the connection cable comprises a fiber optics cable, wherein the EUV radiation source further comprises an image processing system attached to a second end of the fiber optics cable, and the method further comprises transferring the acquired one or more images of the camera through the fiber optics cable to the image processing system.

13. The method of claim 12, further comprising:

comparing, by the image processing system, the amount of tin debris deposited in the IF cap region with a cleaning threshold; and generating, by the image processing system, a signal to clean the EUV radiation source, if the deposited amount of tin debris exceeds the cleaning threshold.

14. The method of claim 13, wherein EUV radiation source further comprises a first motor coupled to the lead screw and a view controller coupled to the first motor to control the first motor, wherein the camera is mounted in a holder that comprises a second motor that controls up-down and left-right motion of the camera, and wherein the method further comprises:

controlling the one or more viewing positions of the camera by the view controller through the first motor; and controlling a viewing angle of the camera by controlling the second motor via the image processing system.

15. A semiconductor manufacturing system, comprising:

a main controller;

an analyzer module coupled to the main controller;

an extreme ultraviolet (EUV) radiation source that comprises:

a chamber;

a first opening of the chamber configured for connecting a droplet generator that is configured to introduce tin droplets into the chamber;

a second opening of the chamber configured for connecting a droplet catcher that is configured to collect tin debris;

an excitation laser for generating a light beam that is configured to focus onto the tin droplets to generate EUV radiation;

a collecting mirror configured for directing the EUV radiation toward a third opening;

a blocking shield between the third opening and the collecting mirror and configured to block the light beam from exiting the chamber through the third opening; and an observation system that comprises:

a flat elongated surface;

an extendible section mounted from a first side of the extendible section on the flat elongated surface;

a camera assembly mounted on a first end of a fiber optics cable, wherein the camera assembly is mounted on a second side, opposite to the first side, of the extendible section; and an image processing system coupled through a second end, opposite the first end, to the fiber optics cable, wherein:

the main controller is configured to move the camera assembly inside the chamber beyond the blocking shield, and the main controller is configured to command the image processing system to acquire one or more images from a region beyond the blocking shield.

16. The semiconductor manufacturing system of claim 15, wherein the main controller is configured to command the image processing system to send the one or more images to the analyzer module, and wherein the analyzer module is configured to analyze the acquired one or more images to determine an amount of tin debris deposited inside the chamber of the EUV radiation source in the region beyond the blocking shield.

17. The semiconductor manufacturing system of claim 15, wherein the extendible section is mounted on the flat elongated surface through a lead screw, and the lead screw of the observation system has two sections, a first right-handed section and a second left-handed section, wherein the extendible section is mounted via:

a first base comprising a rotatable bolt on the first right-handed section, and a second base comprising a rotatable bolt on the second left-handed section, wherein:

the main controller is configured to rotate the lead screw in a first direction to separate the first and second bases from each other thereby to shorten the extendible section, and the main controller is configured to rotate the lead screw in a second direction opposite to the first direction to bring the first and second bases closer to each other thereby to lengthen the extendible section.

18. The semiconductor manufacturing system of claim 15, wherein the extendible section is mounted on the flat elongated surface through a lead screw, and the main controller is configured to rotate the lead screw to move the camera assembly to acquire one or more images by the camera assembly from inside the chamber of the EUV radiation source at one or more viewing positions.

19. The semiconductor manufacturing system of claim 18, wherein:

the main controller is configured to command the image processing system to acquire one or more images from an intermediate focus (IF) cap region that comprises a region of the chamber of the EUV radiation source between the third opening and the blocking shield and to send the acquired one or more images to the analyzer module, and the main controller is configured to command the analyzer module to determine an amount of tin debris deposited in the IF cap region, to compare the amount of tin debris deposited in the IF cap region with a cleaning threshold, and to generate a signal to clean the EUV radiation source if the deposited amount of tin debris exceeds the cleaning threshold.

20. The semiconductor manufacturing system of claim 15, wherein the camera assembly comprises a camera, wherein the main controller is configured to change a viewing angle of the camera.

* * * * *